(12) United States Patent
Choi et al.

(10) Patent No.: US 12,588,173 B2
(45) Date of Patent: Mar. 24, 2026

(54) ELECTRONIC APPARATUS

(71) Applicant: SAMSUNG DISPLAY CO., LTD., Yongin-si (KR)

(72) Inventors: Jangun Choi, Yongin-si (KR); Yongil Kim, Yongin-si (KR); Byoungkyoo Park, Yongin-si (KR); Wee-Joon Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 214 days.

(21) Appl. No.: 18/322,020

(22) Filed: May 23, 2023

(65) Prior Publication Data

US 2024/0064946 A1 Feb. 22, 2024

(30) Foreign Application Priority Data

Aug. 19, 2022 (KR) ......................... 10-2022-0104089

(51) Int. Cl.
*H05K 7/20* (2006.01)

(52) U.S. Cl.
CPC ..... *H05K 7/20972* (2013.01); *H05K 7/20145* (2013.01)

(58) Field of Classification Search
CPC ......... G02F 1/133385; G02F 1/133308; G02F 1/133608; G02F 1/133628; G02F 2201/36; G02F 1/133382; G02F 1/13332; H05K 7/20972; H05K 7/20145; H05K 7/20963; H05K 7/20; H05K 7/20127; H05K 7/20209; G06F 1/1601; G06F 1/20
USPC ....................................................... 361/695
See application file for complete search history.

(56) References Cited

U.S. PATENT DOCUMENTS

| | | | |
|---|---|---|---|
| 7,492,589 B2 | 2/2009 | Park | |
| 7,800,706 B2 | 9/2010 | Kim et al. | |
| 2005/0105012 A1* | 5/2005 | Kim | H04N 5/64 |
| | | | 348/E5.128 |
| 2006/0132699 A1* | 6/2006 | Cho | F04D 29/582 |
| | | | 349/161 |
| 2009/0174626 A1* | 7/2009 | Isoshima | H05K 7/20972 |
| | | | 345/55 |
| 2011/0187962 A1* | 8/2011 | Oh | H05K 7/20972 |
| | | | 349/62 |
| 2012/0223877 A1* | 9/2012 | Cho | G02F 1/13363 |
| | | | 349/5 |

(Continued)

FOREIGN PATENT DOCUMENTS

| | | | | |
|---|---|---|---|---|
| EP | 1 942 367 | * | 7/2008 | |
| EP | 1942367 A2 | * | 7/2008 | ....... G02F 1/133308 |

(Continued)

*Primary Examiner* — Mandeep S Buttar
(74) *Attorney, Agent, or Firm* — F. CHAU & ASSOCIATES, LLC

(57) ABSTRACT

Provided is an electronic apparatus including a display panel, a chassis including a first part disposed adjacent to the display panel, and a second part which is connected to the first part and is spaced apart by a predetermined distance from the display panel to define a flow space between the second part and the display panel, and in which a first opening and a second opening communicating with the flow space are defined, and a cooling module disposed inside or outside of the second part, wherein the second opening is located to be lower than a reference line passing through the center of the display panel.

19 Claims, 12 Drawing Sheets

(56)          References Cited

U.S. PATENT DOCUMENTS

| | | | |
|---|---|---|---|
| 2015/0009625 A1* | 1/2015 | Chin | H05K 7/20145 |
| | | | 361/695 |
| 2021/0181565 A1 | 6/2021 | Ahn et al. | |
| 2021/0231998 A1 | 7/2021 | Noso et al. | |

FOREIGN PATENT DOCUMENTS

| | | |
|---|---|---|
| JP | 2021117428 | 8/2021 |
| KR | 10-0747820 | 8/2007 |
| KR | 10-1315465 | 10/2013 |
| KR | 10-2021-0075893 | 6/2021 |
| KR | 10-2021-0156459 | 12/2021 |
| KR | 10-2333558 | 12/2021 |

* cited by examiner

P22

P21

OP1

F1

CB

FSP

FLW

F2

OP2

P2

OP3

DP-B

DP-F

P1

PT HL DP

DR2

DR3 — DR1

P1 ⎫
    ⎬ SS
P2 ⎭

F1 ⎫
    ⎬ CM
F2 ⎭

ELECTRONIC APPARATUS

CROSS-REFERENCE TO RELATED APPLICATIONS

This U.S. non-provisional patent application claims priority under 35 U.S.C. § 119 of Korean Patent Application No. 10-2022-0104089, filed on Aug. 19, 2022, the entire contents of which are hereby incorporated by reference.

BACKGROUND

The present disclosure herein relates to an electronic apparatus, and more particularly, to an electronic apparatus having heat dissipation characteristics.

Electronic apparatuses, operated by electrical signals, may include display panels, circuit boards, and various electronic components. Display panels may include various display panels operated by electrical signals, for example a liquid crystal display (LCD), a plasma display panel (PDP), an electrophoretic display panel, an organic light emitting diode (OLED) panel, a quantum dot display panel, and the like.

The internal temperature of an electronic apparatus increases due to the heat generated during operation of the display panel, circuit board, or the like. At this time, as the internal temperature of the electronic apparatus increases, electronic components such as elements of a display panel or driving elements of a circuit board may deteriorate, thereby reducing the life of the electronic apparatus and degrading the display quality.

SUMMARY

The present disclosure may provide an electronic apparatus capable of cooling a display panel by forming a cooling air current in a region adjacent to the display panel.

The present disclosure may also provide an electronic apparatus capable of effectively dissipating the heat generated from a display panel, and may thus improving the life of internal components and the life of the electronic apparatus.

According to an embodiment of the present disclosure, an electronic apparatus includes a display panel, a chassis having a first length in a first direction and a second length in a second direction different from the first direction and including a first part adjacent to the display panel, a second part which is connected to the first part and is farther spaced apart from the display panel than the first part, wherein the second part is provided with a first opening and a second opening, and a flow space disposed between the second part and the display panel and connected to the first opening and second opening, and a cooling module disposed on the second part. The second opening is located to be lower than a reference line passing through a center of the display panel and extending in the first direction.

In an embodiment, the second part may include a first sub part adjacent to a rear surface of the display panel and is provided with the first opening and the second opening, and a second sub part bent from a side of the first sub part toward the rear surface of the display panel and connected to the first part.

In an embodiment, the second sub part may include a first surface and a second surface spaced apart from each other in the first direction and facing each other with the flow space therebetween, the first surface and the second surface are bent along the second direction, and wherein a gap in the first direction between the first surface and the second surface changes along the second direction.

In an embodiment, the first opening may be above the second opening in the second direction.

In an embodiment, a center of the first opening and a center of the second opening may be disposed at a straight line extending in the second direction.

In an embodiment, the second opening may be defined at a location of the chassis, corresponding to about 5% to about 35% of the height, in the second direction, of the display panel.

In an embodiment, the cooling module may include at least one of a first fan adjacent to the first opening and a second fan adjacent to the second opening.

In an embodiment, the first fan may be located inside the flow space and the second fan is located outside the flow space.

In an embodiment, the first fan may include a first suctioning part configured to suction gas in the flow space, and a first discharging part configured to discharge the gas suctioned by the first suctioning part to the outside of the first fan, and the second fan includes a second suctioning part configured to suction gas from the outside of the second fan and a second discharging part configured to discharge the gas suctioned by the second suctioning part to the flow space.

In an embodiment, the electronic apparatus may further include a thermoelectric layer located between the display panel and the chassis, and adjacent to the display panel.

In an embodiment, the thermoelectric layer may be made of carbon.

In an embodiment, the thickness of the thermoelectric layer may be less than or equal to the thickness of the display panel.

In an embodiment, the electronic apparatus may further include a plate disposed between the rear surface of the display panel and the chassis, wherein the plate has a third opening defined therein, and wherein, when the plate and the chassis are projected onto a same plane, the first opening and the second opening are disposed within an outer boundary of the third opening.

In an embodiment, the electronic apparatus may further include a circuit board spaced apart from the rear surface of the display panel, and the chassis is disposed between the circuit board and the rear surface of the display panel.

In an embodiment of the present disclosure, an electronic apparatus includes a display panel, a chassis having a first length in a first direction and a second length in a second direction different from the first direction and including a first part adjacent to the display panel, a second part which is connected to the first part and is farther spaced apart from the display panel than the first part, wherein the second part is provided with a first opening and a second opening, and a flow space between the second part and the display panel, a circuit board spaced apart from the display panel, wherein the second part is disposed between the circuit board and the display panel, and a cooling module supported by the second part, The cooling module is configured to form air current in the flow space via the first opening and the second opening. The circuit board is located at a region of the second part between the first opening and the second opening.

In an embodiment, the second part may include a first sub part adjacent to a rear surface of the display panel and is spaced apart by a predetermined distance therefrom, and provided with the first opening and the second opening are defined, and a second sub part bent from the side of first sub part toward the rear surface of the display panel and connected to the first part, and the circuit board is disposed on the first sub part.

In an embodiment, a center of the first opening and a center of the second opening may be disposed at a straight line extending in the second direction, and the first opening is defined above the second opening in the second direction.

In an embodiment, the second opening may be located to be lower than a reference line passing through a center of the rear surface of the display panel and extending in the first direction.

In an embodiment, the cooling module may include at least one of a first fan adjacent to the first opening and a second fan adjacent to the second opening, the first fan is located inside the flow space, and the second fan is located outside the flow space.

In an embodiment, the electronic apparatus may include a thermoelectric layer located between the rear surface of the display panel and the chassis, and disposed closer to the rear surface of the display panel than to the chassis.

BRIEF DESCRIPTION OF THE FIGURES

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
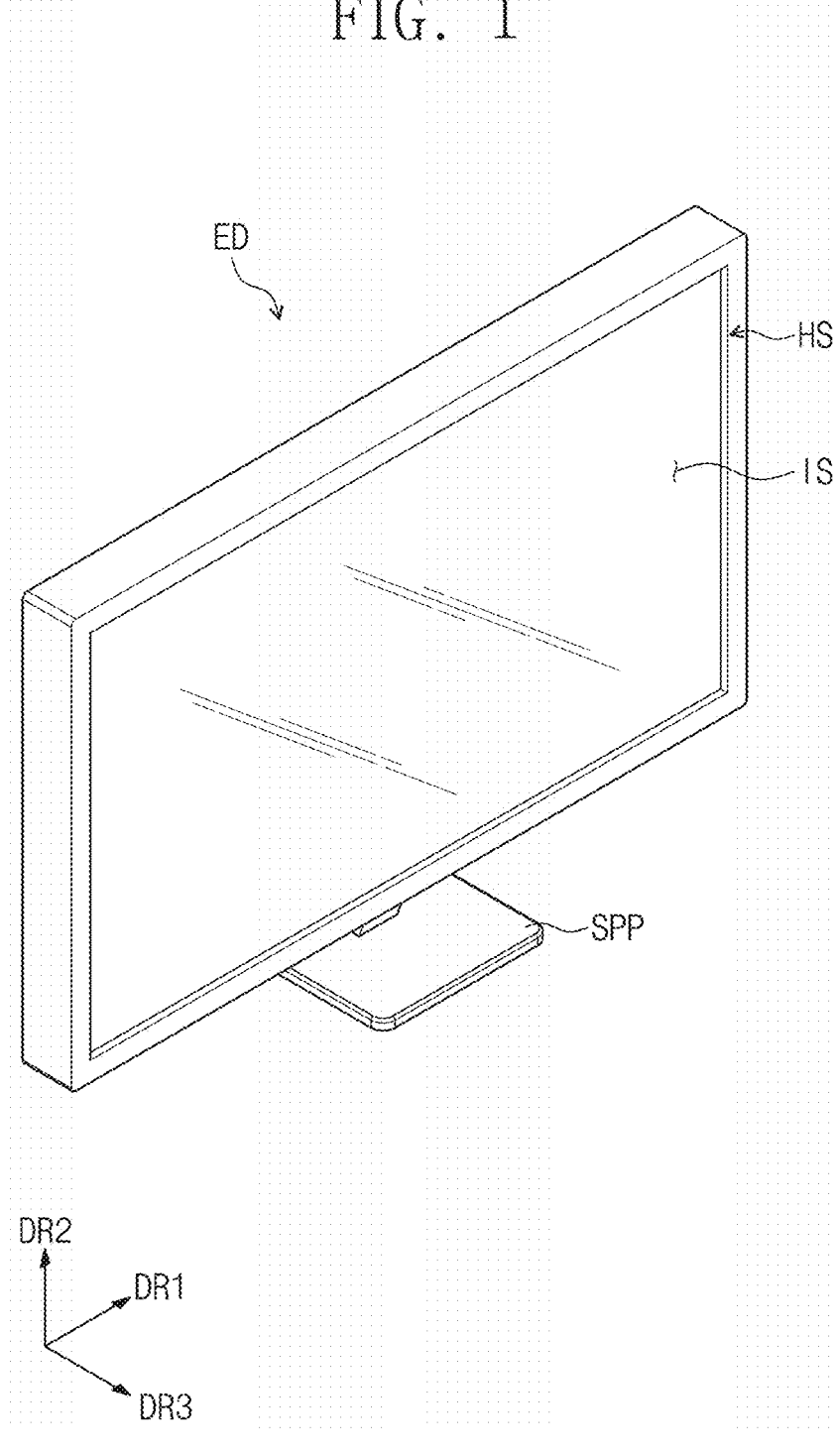
FIG. 1 is a perspective view of an electronic apparatus according to an embodiment of the present disclosure.

In this specification, it will be understood that when an element (or a region, a layer, a portion, or the like) is referred to as being "on", "connected to" or "coupled to" another element, it may be directly disposed on, connected or coupled to the other element, or intervening elements may be disposed therebetween.

Like reference numerals or symbols refer to like elements throughout. In the drawings, the thickness, the ratio, and the size of the element are exaggerated for effective description of the technical contents. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of the present invention. Similarly, a second element, component, region, layer or section may be termed a first element, component, region, layer or section. As used herein, the singular forms, "a", "an" and "the" are intended to include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be further understood that the terms "includes" and/or "have", when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in detail with reference to the accompanying drawings.

Figure 2:
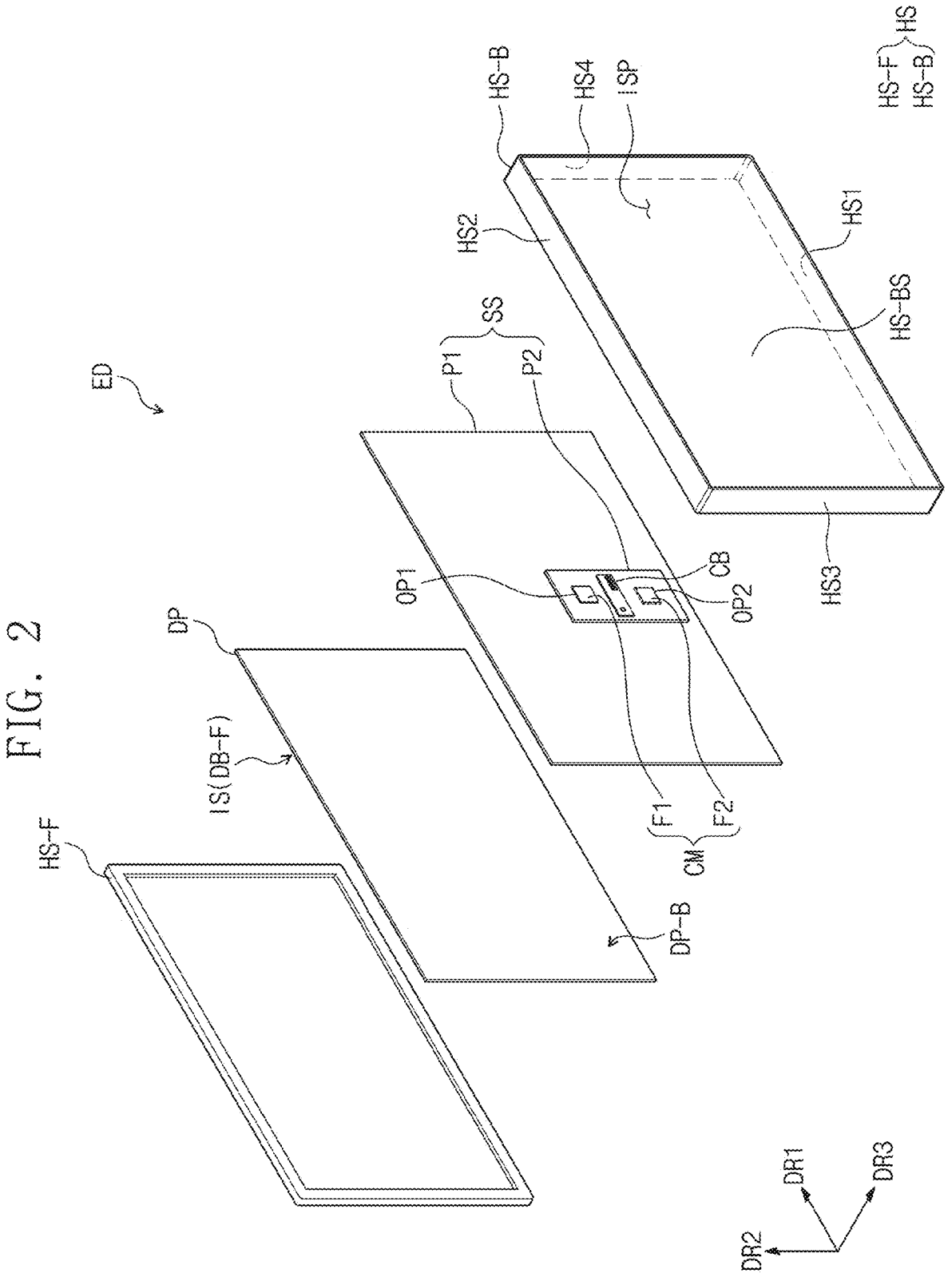
FIG. 2 is an exploded perspective view of the electronic apparatus illustrated in FIG. 1.

FIG. 1 and FIG. 2 are perspective views of an electronic apparatus according to an embodiment of the present disclosure.

An electronic apparatus ED according to an embodiment of the present disclosure may include a display panel and a housing HS.

The electronic apparatus illustrated in FIG. 1 may be a large electronic apparatus ED such as a television, a monitor, or a billboard. Meanwhile, those listed as examples of the electronic apparatus ED are only presented as embodiments, and other apparatuses may also be employed without departing from the idea of the present disclosure. For example, the electronic apparatus ED may be a small- or medium-sized electronic apparatus ED such as a smartphone, a personal computer, a laptop computer, a personal digital assistant, a car navigator, and a game console. The electronic apparatus ED may display images through a display surface IS.

FIG. 1 illustrates the display surface IS provided on a surface which is defined by a first direction axis DR1 and a second direction axis DR2 crossing the first direction axis DR1. However, an embodiment of the present disclosure is not limited thereto, and in an embodiment, the display surface IS may be provided on a curved surface. For example, the electronic apparatus ED may include a display apparatus having a flat display surface IS, or a curved display apparatus.

The electronic apparatus ED or the display apparatus may have a three-dimensional shape having a predetermined thickness in a third direction axis DR3 perpendicular to the plane surface defined by the first direction axis DR1 and the second direction axis DR2. In this specification, a top surface (or front surface DP-F) and a bottom surface (or rear surface DP-B) of each member are defined with respect to a direction in which an image is displayed on the display surface IS. The top surface and the bottom surface may be opposed to each other in the third direction axis DR3, and the normal direction of each of the top surface and the bottom surface may be parallel to the third direction axis DR3. Meanwhile, the directions indicated by the first through third direction axes DR1, DR2, and DR3 are relative concepts, and may thus be changed to other directions. Hereinafter, first through third directions are referred to as the directions indicated by the first through the third direction axes DR1, DR2, and DR3, and may be denoted as the same reference numerals or symbols.

The housing HS may include or may be formed of a material with relatively high rigidity. For example, the housing HS may include a plurality of frames made of glass, plastic, or metal. The housing HS provides a predetermined inner space ISP. The display apparatus may be accommodated in the inner space ISP and thus protected from external impact.

Alternatively, when the electronic apparatus ED includes a curved display surface IS, unlike what is illustrated in FIG. 1, the housing HS may have a curved shape, and the display apparatus may be fixed in a curved shape conforming to the curved shape of the housing HS.

Although not illustrated in the drawing, the housing HS may include a plurality of holes that communicate with the inner space ISP, and each of the holes may be an air vent through which air is discharged or introduced. Through air bents, the housing HS may have improved heat dissipation characteristics.

A support SSP may be coupled to the housing HS. The support SSP may be provided separately from the housing HS or may be integrated with the housing HS. The support SSP may be omitted, but an embodiment of the present disclosure is not limited thereto.

FIG. 2 is an exploded perspective view of the electronic apparatus of FIG. 1.

Referring to FIG. 2, the housing HS may include a front surface frame HS-F and a rear surface frame HS-B. The front surface frame HS-F and the rear surface frame HS-B are coupled together to form the housing HS.

The front surface frame HS-F covers a front surface DP-F of a display panel DP. Specifically, the front surface frame HS-F covers the display surface IS of the front surface DP-F of the display panel DP. A user may view the image displayed in the display panel DP through the front surface frame HS-F.

The rear surface frame HS-B is disposed on a rear surface DP-B of the display panel DP with the display panel DP and a circuit board CB therebetween, and coupled to the front surface frame HS-F.

The rear surface frame HS-B and the front surface frame HS-F are coupled together with each other to define the inner space ISP. The inner space ISP may accommodate the display panel DP and the circuit board CB.

The rear surface frame HS-B may include a rear surface part HS-BS and a plurality of side surfaces HS1, HS2, HS3, and HS4. The rear surface part HS-BS may be parallel to the display panel DP. In this embodiment, the rear surface part HS-BS may have a quadrilateral shape defined by the first direction and the second direction. However, this is only an example, and thus the rear surface part HS-BS may have various shapes as long as the rear surface part may provide the inner space ISP for accommodating the display panel DP and the circuit board CB therein. The shape of the rear surface part is not limited to any one embodiment of the present disclosure.

The side surfaces HS1, HS2, HS3, and HS4 are bent from the four sides of the rear surface part HS-BS, respectively. Each of the side surfaces HS1, HS2, HS3, and HS4 may define the depth of the inner space ISP in the third direction. The side surfaces HS1, HS2, HS3, and HS4 may include a first side surface HS1 through a fourth side surface HS4.

The first side surface HS1 is connected to one side of the rear surface part HS-BS extending along the first direction, and extends along the first direction. The first side surface HS1 may define a bottom end section of the housing HS.

The second side surface HS2 is connected to another side of the rear surface part HS-BS extending along the first direction, and extends along the first direction.

The third side surface HS3 is connected to one side of the rear surface part HS-BS extending along the second direction, and extends along the second direction. The fourth side surface HS4 is connected to another side of the rear surface part HS-BS extending along the second direction, and extends along the second direction. The third side surface HS3 and the fourth side surface HS4 may be spaced apart from each other and parallel to each other in the first direction. The third side surface HS3 and the fourth lateral surface HS4 may be connected to the first side surface HS1 and the second side surface HS2.

A chassis SS may be accommodated in the inner space ISP of the housing HS. Specifically, the chassis SS may be located between the display panel DP and the rear surface frame HS-B of the housing HS. The thickness of the chassis SS may be less than the thickness of the housing HS.

The chassis SS may include a first part P1 and a second part P2. The first part P1 may be disposed adjacent to the display panel DP. The first part P1 may be coupled to the display panel DP or the housing HS. The first part P1 may be in close contact with the display panel DP. However, an embodiment of the present disclosure is not limited thereto, and the first part P1 may be spaced apart by a predetermined distance from the display panel DP.

The second part P2 is spaced apart by a predetermined distance from the display panel DP. The second part P2 may be connected to the first part P1 to define a flow space FSP between the display panel DP and the second part P2.

The first part P1 and the second part P2 may be disposed facing the rear surface DP-B of the display panel DP. In some embodiments, the second part P2 may be further spaced apart from the rear surface DP-B of the display pane DP than the first second part P1.

The second part P2 may include a first opening OP1 and a second opening OP2 which communicate with the flow space FSP. Through the first opening OP1 and the second opening OP2, the gas inside and outside the flow space FSP (see FIG. 3B to be described herein later) may flow in and out.

Through a cooling module CM to be described herein later, in an embodiment of the present disclosure, the gas in the flow space FSP may be discharged through the first opening OP1, and gas may be introduced through the second opening OP2 from the outside of the flow space FSP into the flow space FSP, thereby inducing forced convection in the flow space FSP. Such forced convection formed in the flow space FSP may cool the display panel DP using the cooling module CM.

The first opening OP1 may be defined above the second opening OP2. Specifically, the first opening OP1 may be defined higher than the second opening OP2 with respect to a direction parallel to the height direction of the second part P2. Locating one opening above another opening may cause a natural convection flow, and thereby improve the fluidity of gas in the flow space FSP in conjunction with the forced convection as mentioned above. Accordingly, the display panel DP may be more effectively cooled, compared to the case where only one phenomenon among the forced convection phenomena (i.e., a forced convection flow) and a natural convection phenomena (i.e., a natural convection flow) occurs. That is, the electronic apparatus ED may have improved heat dissipation capabilities.

The chassis SS may be made of a material which is the same as or different from that of the housing HS, and the material of the chassis SS is not limited to any one embodiment of the present disclosure.

The cooling module CM may be disposed inside or outside of the second part P2. The cooling module CM may generate a flow of gas in the flow space FSP. In particular, the cooling module CM may induce a forced convection phenomenon in the flow space FSP. The cooling module CM may cause the inflow and outflow of gas through the first opening OP1 and the second opening OP2 and emit the heat in the flow space FSP to the outside. At this time, heat exchange may occur between the gas in the flow space FSP and the display panel DP, and the display panel DP may be cooled. Accordingly, the display panel DP may be continuously cooled by emitting the heat to the outside.

The cooling module CM may include a first fan F1 and a second fan F2. The first fan F1 and the second fan F2 may be supported by the second part P2. The first fan F1 and the second fan F2 may be fixed to the second part P2 by welding. However, an embodiment of the present disclosure is not limited thereto, and the first fan F1 and the second fan F2 may be coupled to the second part P2 with a coupling member such as a screw. The coupling or fixing of the first and second fans is not limited to any one embodiment of the present disclosure.

The first fan F1 may be disposed in contact with the first opening OP1, and the second fan F2 may be disposed in contact with the second opening OP2. In some embodiments, the first fan F1 may cover the first opening OP1, and the second fan F2 may cover the second opening OP2. The first fan F1 may discharge the gas in the flow space FSP to the outside through the first opening OP1, and the second fan F2 may introduce gas from the outside into the flow space FSP through the second opening OP2.

The circuit board CB may be disposed in the inner space ISP of the housing HS. In particular, the circuit board CB may be disposed in the chassis SS. The circuit board CB may be disposed between the first opening OP1 and the second opening OP2 in the second part P2.

Figure 3A:
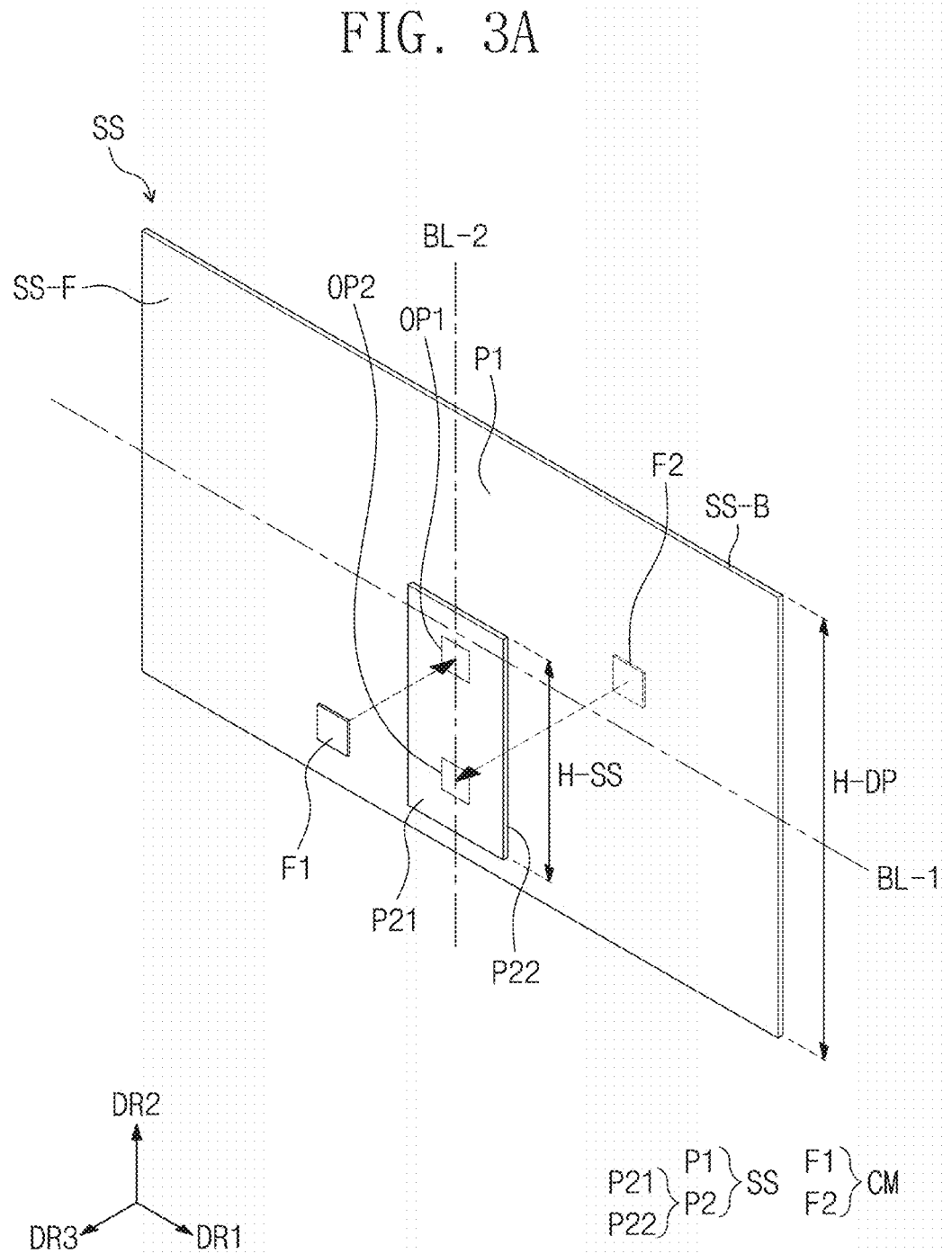
FIGS. 3A and 3B are exploded perspective views of a portion of an electronic apparatus according to an embodiment of the present disclosure.
Figure 3B:
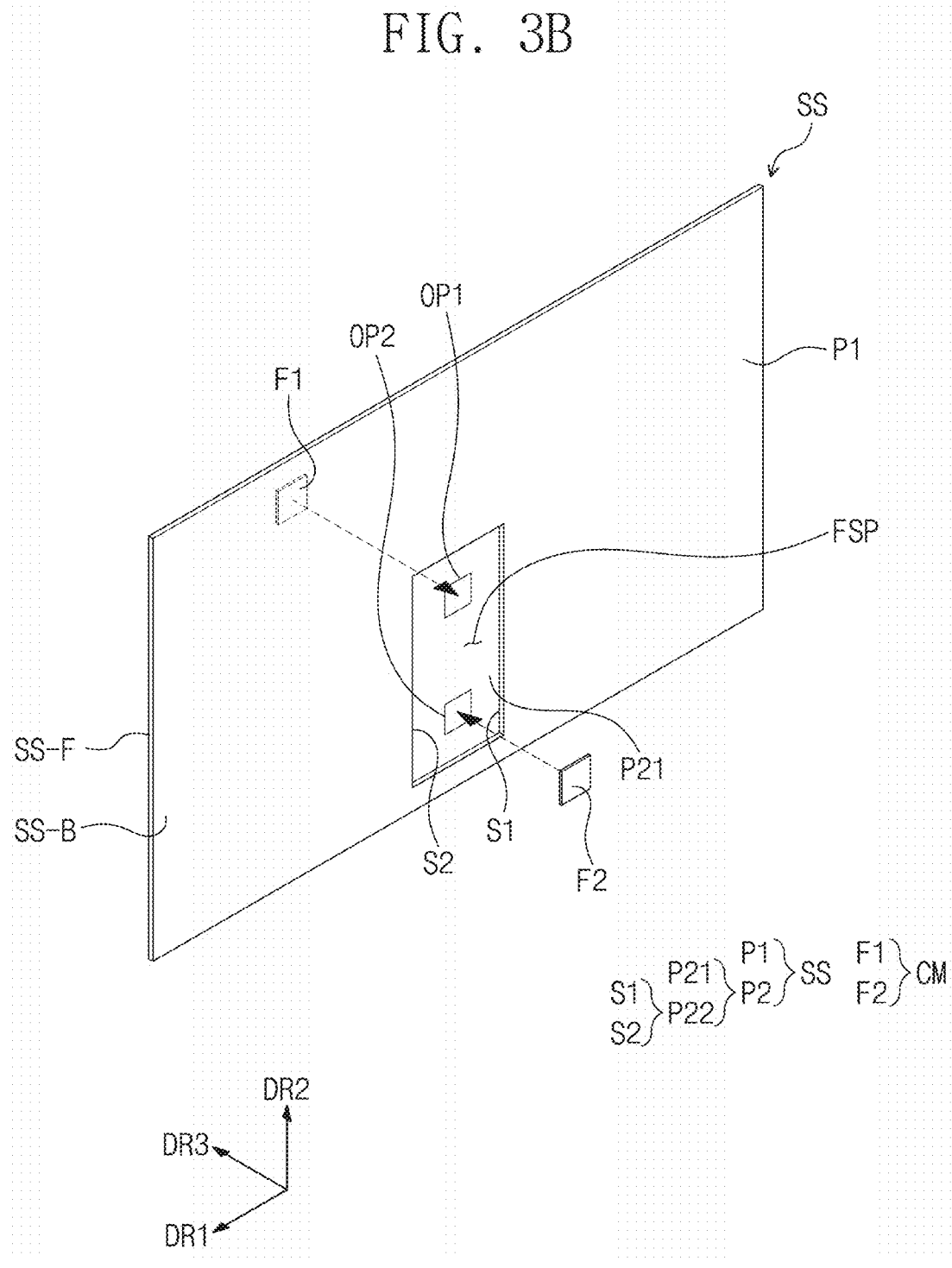

FIGS. 3A and 3B are exploded perspective views of a portion of the electronic apparatus according to an embodiment of the present disclosure.

Specifically, FIG. 3A is a perspective view when the chassis SS is viewed from the direction facing the rear surface DP-F of the display panel DP. FIG. 3B is a perspective view when the chassis SS is viewed from the direction facing the front surface DP-F of the display panel DP.

Meanwhile, the same components that have previously been described with reference to FIGS. 1 and 2 are denoted as the same reference numerals or symbols, and duplicate descriptions thereof will be omitted. In addition, the display panel DP and the housing HS are omitted from FIGS. 3A and 3B. Referring to FIGS. 2, 3A, and 3B, the rear surface DP-B of the display panel DP and the rear surface SS-B of the chassis SS may be disposed facing each other, and the front surface SS-F of the chassis SS may be disposed facing the rear surface frame HS-B of the housing HS.

Referring to FIGS. 3A and 3B, the chassis SS may include the first part P1 and the second part P2. The second part P2 may be bent and extend to be connected to the first part P1. The first part P1 and the second part P2 may define the flow space FSP. In the flow space FSP, the air current may be formed.

In the second part P2, the first opening OP1 and the second opening OP2 which communicate with the flow space FSP may be defined. In some embodiments, the second part P2 may be provided with the first opening OP1 and the second opening OP2, which are connected to the flow space FSP. For example, the second part P2 may include a plate body, and the first opening OP1 and the second opening OP2 penetrate the plate body to be connected to the flow space FSP. A forced convection phenomenon may occur in the flow space FSP though the cooling module, the first opening OP1, and the second opening OP2.

The height and the width of the second part P2 may be less than or equal to the height and the width of the first part P1.

According to an embodiment of the present disclosure, the height H-SS of the second part P2 may be about 50% or less of the height H-DP of the first part P1. Specifically, the length of the second part P2 in the height direction may be about 50% or less of the length H-DP of the first part P1 in the height direction. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Here, the length H-DP of the first part P1 in the height direction may correspond to the length of the display panel DP (see FIG. 2) in the height direction. That is, the length H-DP of the second part P2 in the height direction may correspond to the length of the display panel DP (see FIG. 2) in the height direction.

In addition, the width of the second part P2 may be about 15% or less of the width of the first part P1.

When the width of the second part P2 is about 15% or less of the width of the first part P1, and the height H-SS of the second part P2 is about 50% or less of the height H-DP of the first part P1, a flow of gas in the flow space FSP may be facilitated during the forced or natural convection phenomenon.

As illustrated in the drawing, a portion of the second part P2 may be located to be lower than the reference line BL-1 passing through the center of the display panel DP and extending in a direction crossing the height direction of the display panel DP. However, an embodiment of the present disclosure is not limited thereto, and the entire second part P2 may be located to be lower than the reference line BL-1 passing through the center of the display panel DP.

The second part P2 may include a first sub part P21 and a second sub part P22.

The first sub part P21 may face the rear surface DP-B (see FIG. 2) of the display panel DP (see FIG. 2) and may be spaced apart by a predetermined distance therefrom, and the second sub part P22 may be bent from the first sub part P21 toward the rear surface DP-B of the display panel DP to be connected to the first part P1. At this time, the second sub part P22 may be bent perpendicular to the first sub part P21, but an embodiment of the present disclosure is not limited thereto.

In the first sub part P21, the first opening OP1 and the second opening OP2 which communicate with the flow space FSP are defined, and the second sub part P22 may define the flow space FSP between the rear surface DP-B of the display panel DP and the second sub part P22.

The first opening OP1 may be defined above the second opening OP2 with respect to a direction parallel to the height direction of the second part P2. The first opening OP1 and the second opening OP2 are located on upper side with respect to a direction parallel to the height direction of the second part P2, thereby inducing a convection phenomenon and thus facilitating an air current FLW.

For example, the center of the first opening OP1 and the center of the second opening O2 may be disposed on a same line BL-2 with respect to a direction parallel to the height direction of the chassis SS.

The second opening OP2 may be located to be lower than the reference line BL-1 passing through the center of the display panel DP and extending in a direction crossing the height direction of the display panel DP.

The display panel DP (see FIG. 2 previously described) does not have uniform temperature across all regions therein. The temperature of a lower region in the display panel DP is set to be higher than those of the other regions. For example, the temperature of the region corresponding to about 10% to about 30% of the height of the display panel DP may be set to be higher than those of the other regions in the display panel DP. This region is hereinafter referred to as a highest temperature region H-S (see FIG. 7A or 7B to be described herein later).

According to an embodiment, the highest temperature region H-S of the display panel DP may be formed in a location corresponding to about 20% of the height of the display panel DP, but an embodiment of the present disclosure is not limited thereto.

The second opening OP2 may be defined in a portion of the chassis SS corresponding to about 5% to about 35% of the height of the display panel DP. In particular, the second opening OP2 may be defined in a location of the second part P2 corresponding to about 5% to about 35% of the height of the display panel DP. For example, the second opening OP2 may be defined in a location which corresponds to about 20% of the height of the display panel DP, and which is the center of the second opening OP2, but an embodiment of the present disclosure is not limited thereto.

According to an embodiment, when the highest temperature region H-S of the display panel DP is formed in a location corresponding to about 20% of the height of the display panel DP, the second opening OP2 may be defined in a location of the chassis corresponding to about 0% to about 25% of the height of the display panel DP, but an embodiment of the present disclosure is not limited thereto.

That is, the second opening OP2 may be defined at a region of the chassis SS, which is adjacent to the highest temperature region of the display panel DP. Accordingly, it is possible to increase an area of the highest temperature region of the display panel DP in which the heat transfer occurs using the air current FLW in the flow space FSP during the natural convection phenomenon occurring through the first opening OP1 and the second opening OP2, or the forced convection phenomenon occurring through the cooling module CM.

For example, the second opening OP2 may be defined in a location of the chassis SS corresponding to about 0% to about 25% of the height of the display panel DP, but an embodiment of the present disclosure is not limited thereto.

The first fan F1 of the cooling module CM may be disposed adjacent to the first opening OP1, and the second fan F2 may be disposed adjacent to the second opening OP2. The first fan F1 and the second fan F2 are disposed respectively on one surface and the other surface of the second part P2. As the first opening OP1 and the second opening OP2 are spaced apart from each other, the first fan F1 and the second fan F2 are also spaced apart from each other.

Referring to FIG. 3B, the second sub part P22 may include a first surface S1 and a second surface S2. The first surface S1 and the second surface S2 face each other and are spaced apart from each other. The flow space FSP may exist between the first surface S1 and the second surface S2. The air current FLW due to a natural and a forced convection phenomena is formed in the flow space FSP between the first surface S1 and the second surface S2.

Figure 4A:
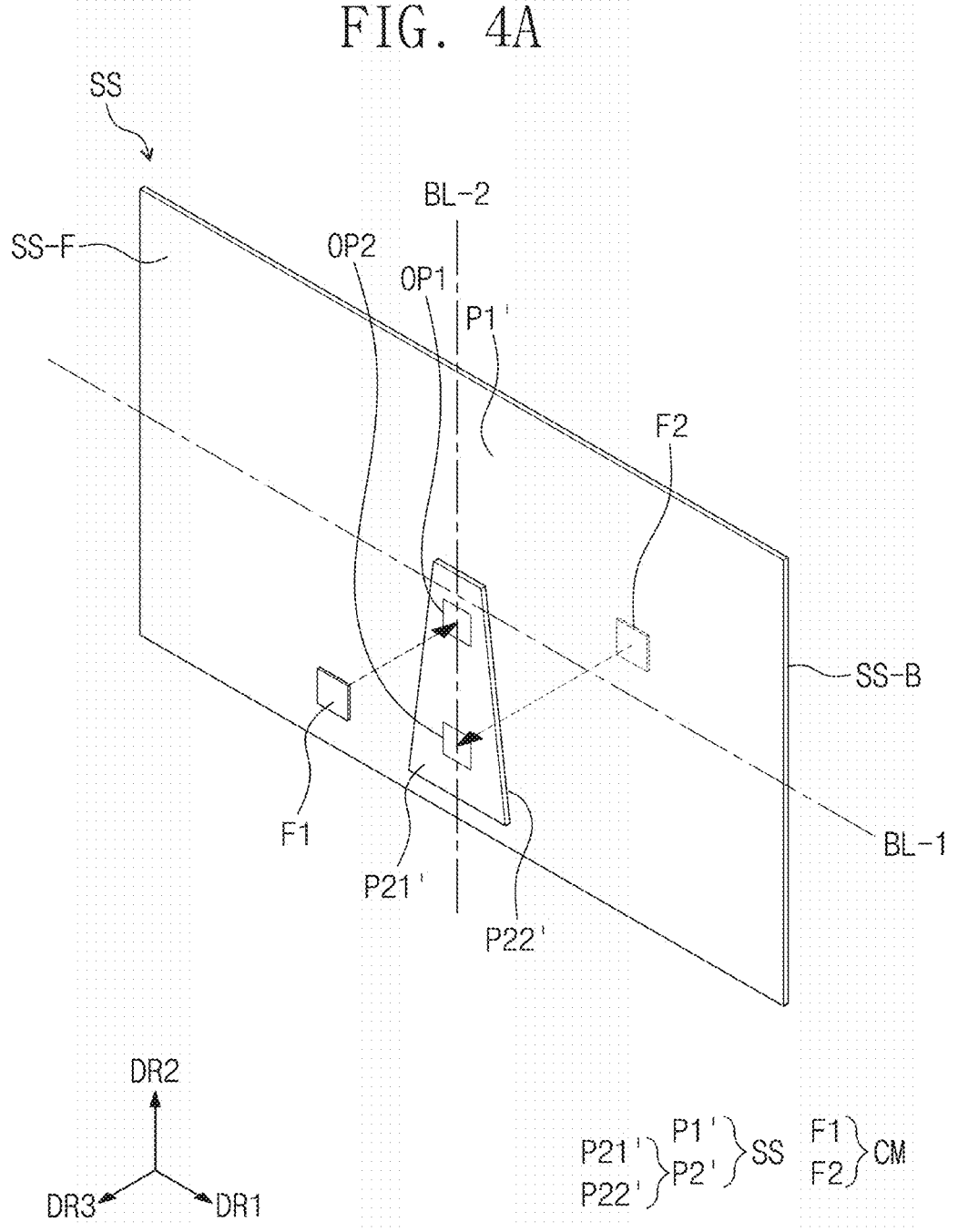
FIGS. 4A and 4B are perspective views of a chassis according to an embodiment of the present disclosure.
Figure 4B:
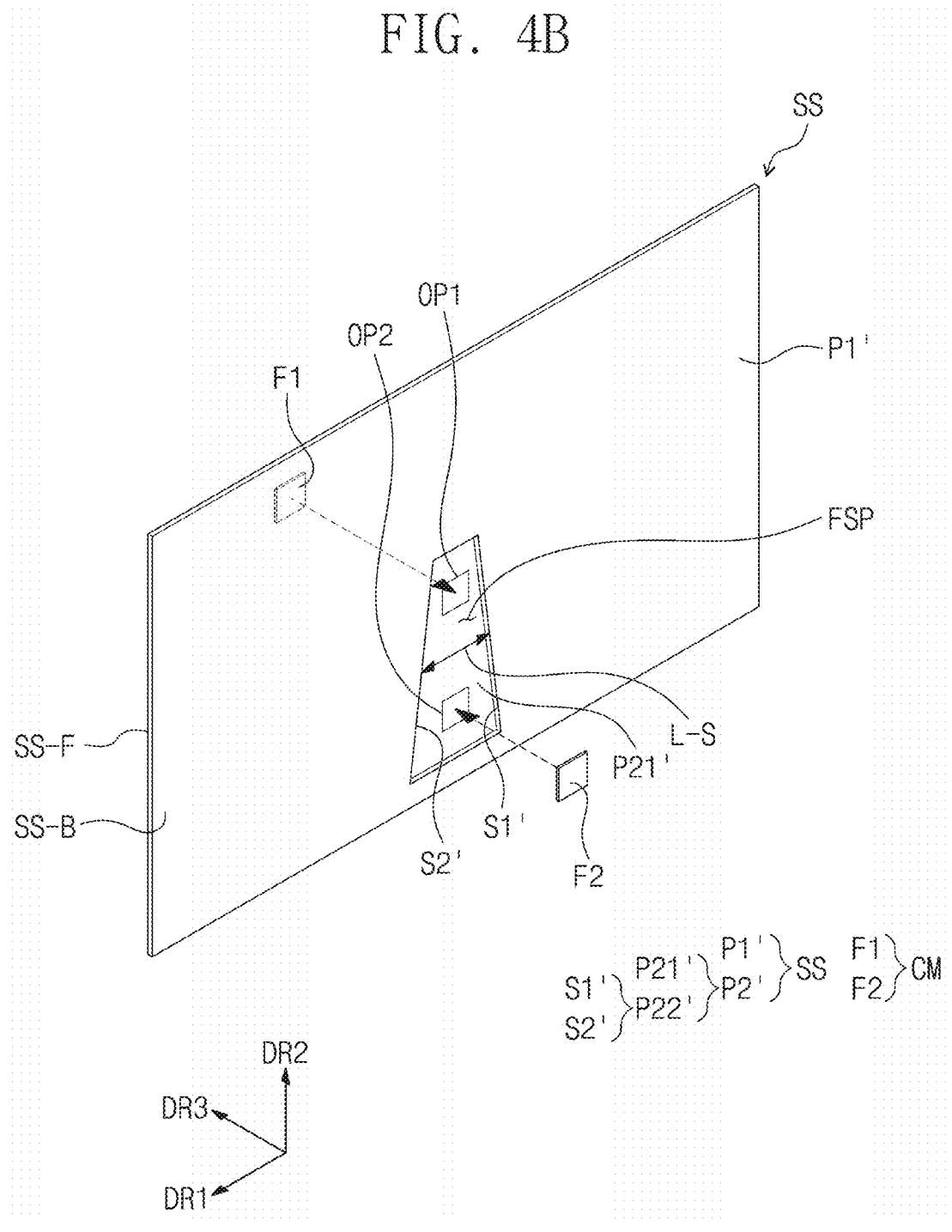

FIGS. 4A and 4B are perspective views of a chassis according to an embodiment of the present disclosure.

Specifically, FIG. 4A is a perspective view when a chassis SS is viewed from the direction facing the rear surface DP-B of the display panel DP. FIG. 4B is a perspective view when the chassis SS is viewed from the direction facing the front surface DP-F of the display panel DP.

Compared to the first part P1 and the second part P2 of the chassis SS in FIGS. 3A and 3B according to an embodiment of the present disclosure, the chassis SS in FIGS. 4A and 4B according to an embodiment of the present disclosure shows a difference in terms of the shapes of the first part P1' and the second part P2'.

Meanwhile, the same components that have previously been described with respect to FIGS. 1 through 3 are denoted as the same reference numerals or symbols, and duplicate descriptions thereof will be omitted.

Referring to FIG. 4A, the second part P2' according to an embodiment of the present disclosure may be provided in a shape such that the second part P2' is narrowed toward the upper portion of the chassis SS. Specifically, the length of the top side of the second part P2' may be less than the length of the bottom side of the second part P2', and the width of the second part P2' may be narrowed along the height direction of the first sub part P21'. The shape of the first part P1' may also change according to the second part P2'.

Likewise, the first opening OP1 and the second opening OP2 are defined in the first sub part P21'. The first fan F1 of the cooling module is disposed adjacent to the first opening OP1, and the second fan F2 is disposed adjacent to the second opening OP2.

Referring to FIG. 4B, the second sub part P22' may include a first surface S1 ' and a second surface S2' facing each other with the flow space FSP therebetween.

The first surface S1' and the second surface S2' are bent along the height direction of the display panel DP, and thus a gap between the first surface S1' and the second surface S2' may change. According to an embodiment of the present disclosure, a gap between the first surface S1' and the second surface S2' may be reduced along the height direction of the display panel DP.

In particular, a gap L-S between the first surface S1' and the second surface S2' may be gradually reduced along the height direction of the display panel DP or the height direction of the second part P2'. By gradually reducing the gap L-S between the first surface S1' and the second surface S2' along the height direction, it is possible to facilitate the flow of gas in the flow space FSP.

Figure 5A:
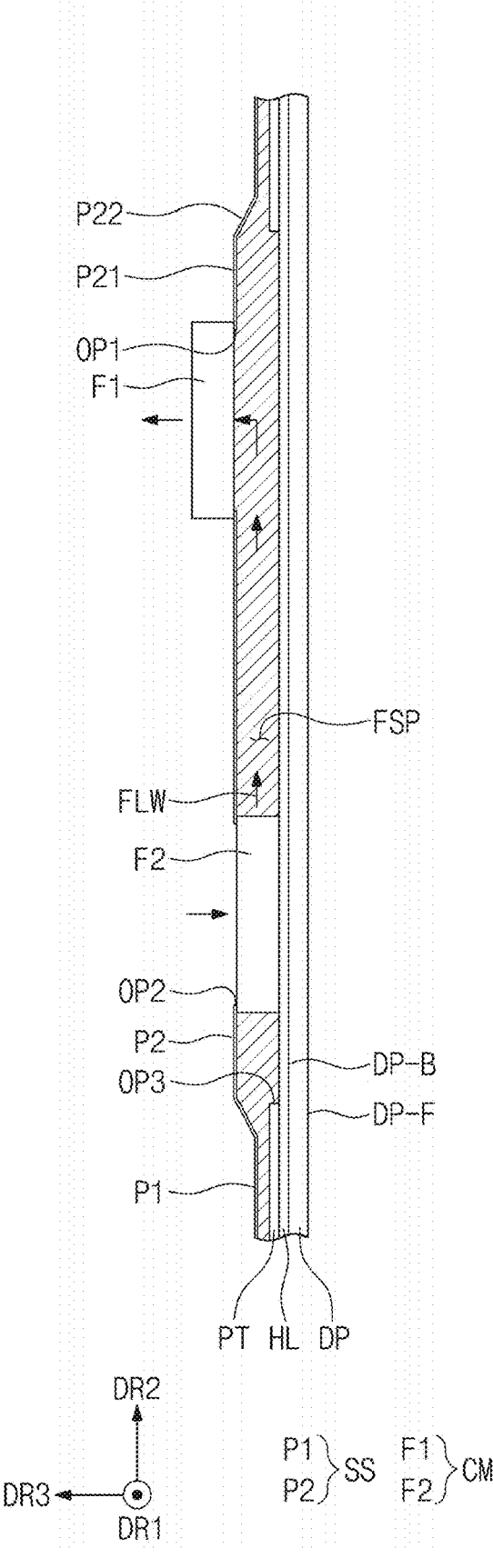
FIGS. 5A and 5B are side views of an electronic apparatus according to an embodiment of the present disclosure.
Figure 5B:
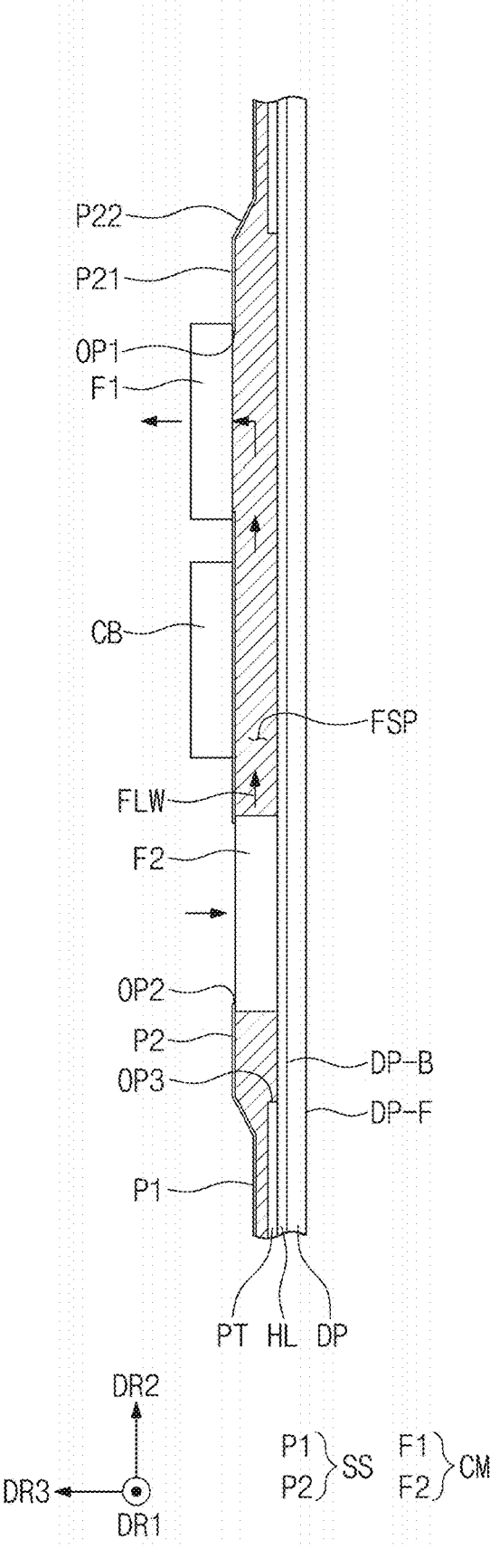

FIGS. 5A and 5B are side views of an electronic apparatus according to an embodiment of the present disclosure.

FIG. 5A is a side view illustrating an arrangement relationship of the panel, the chassis SS and the cooling module CM.

The first part P1 of the chassis SS may extend in a direction parallel to the rear surface DP-B of the display panel DP. A portion of the second part P2 of the chassis SS may extend in a direction parallel to the rear surface DP-B of the display panel DP.

Specifically, the first sub part P21 may include a rear surface parallel to the rear surface DP-B of the display panel DP, and the second sub part P22 may include a rear surface inclined from the rear surface of the first sub part P21 and may be connected to the first part P1.

The first fan F1 located above the chassis SS discharges gas in the flow space FSP to the outside through the first opening OP1. The second fan F2 located below the chassis SS introduces gas from the outside into the flow space FSP through the second opening OP2.

At this time, as the first opening OP1 is located above the second opening OP2, a convection phenomenon occurs, resulting in an air current FLW. That is, in the flow space FSP of the chassis SS, the air current FLW, that is natural convection, from the lower portion to the upper portion may occur, and thereby improve the heat dissipation characteristic of the electronic apparatus ED.

In addition, referring to the drawing, the air current FLW may occur due to the forced convection from the second fan F2 located below the second part P2 to the first fan F1 located above the second part P2.

Through the air current FLW in the flow space FSP due to the natural or forced convection, the cooling effect by heat exchange with the display panel DP or a thermoelectric layer HL, to be described herein later, may be expected, and such an effect may improve the heat dissipation characteristic of the electronic apparatus ED.

A thermoelectric layer HL may be disposed between the display panel DP and the chassis SS. The thermoelectric layer HL may be in contact with the rear surface DP-B of the display panel DP, or may be disposed to be spaced apart by a predetermined distance therefrom, but an embodiment of the present disclosure is not limited thereto. That is, the thermoelectric layer HL may be located between the rear surface DP-B of the display panel DP and the chassis SS, and disposed more adjacent to the rear surface DP-B of the display panel DP than to the chassis SS.

The thermoelectric layer HL may be made of a material with good heat conduction, and thus the heat is dissipated easily by the air current FLW when the air current FLW is formed in the flow space FSP, thereby facilitating heat transfer of the display panel DP.

According to an embodiment of the present disclosure, the thermoelectric layer HL may be made of carbon. In addition, increasing the surface area of the thermoelectric layer HL may further facilitate heat transfer of the display panel DP. The thickness of the thermoelectric layer HL may be less than or equal to the thickness of the display panel DP. However, this is only an example, and an embodiment of the present disclosure is not limited thereto.

A plate PT may be disposed between the display panel DP and the chassis SS. The plate PT may increase the rigidity of the electronic apparatus ED.

In the plate PT, a third opening OP3 is defined.

The third opening OP3 may be defined to correspond to the area overlapping the first sub part P21 when the plate PT and the first sub part P21 are projected onto a same plane.

In some embodiments, when the plate PT and the chassis SS are projected onto a same plane, the first opening OP1 and the second opening OP2 may be disposed within an outer boundary of the third opening OP3. Specifically, when the plate PT and the first sub part P21 are projected onto a same plane, the first sub part P21 and the third opening OP3 may overlap, and the diameter of the third opening OP3 may correspond to the area overlapping the first sub part P21. That is, the diameter of the third opening OP3 may be less than or equal to the diameter of the first sub part P21.

The third opening OP3 may be defined in the plate PT such that the first opening OP1 and the second opening OP2 defined in the first sub part P21 face the display panel DP or the thermoelectric layer HL. That is, the effective heat exchange may be induced between the display panel DP or the thermoelectric layer HL and the air current FLW which is formed by the first fan F1 and the second fan F1 adjacent respectively to the first opening OP1 and the second opening OP2.

As a result, the heat dissipation of the electronic apparatus ED may be achieved, and using the plate PT may also ensure the rigidity of the electronic apparatus ED.

FIG. 5B is a side view illustrating a state in which a circuit board CB is additionally disposed on the second part P2 in the electronic apparatus ED of FIG. 5A.

Meanwhile, the same components that have been previously described with reference to FIGS. 1 through 4 are denoted as the same reference numerals or symbols, and duplicate descriptions thereof will be omitted.

The circuit board CB may be disposed on a region of the second part P2 between the first opening OP1 and the second opening OP2.

A part of the heat generated from the circuit board CB may be transferred through the second part P2 to the flow space FSP.

At this time, the heat transferred to the flow space FSP may be transferred to the outside of the flow space FSP by the flow of gas in the flow space FSP. The circuit board CB may be disposed in a location other than the location between the first opening OP1 and the second opening OP2, but the location of the circuit board CB is not limited to any one embodiment of the present disclosure.

When the air current FLW is formed by the natural convection due to the locations of the first opening OP1 and the second opening OP2 or the forced convection through the cooling module CM, and the display panel DP is directly cooled through heat transfer, a part of the heat generated from the circuit board CB may also be emitted to the outside through the flow space FSP and thus the circuit board CB may also be cooled. As a result, the space efficiency as well as the heat dissipation characteristic of the electronic apparatus ED may be improved.

FIGS. 6A through 6D are enlarged side views of a portion of the electronic apparatus according to an embodiment of the present disclosure.

Meanwhile, the same components that have been previously described with reference to FIG. 5 are denoted as the same reference numerals or symbols, and duplicate descriptions thereof will be omitted.

Figure 6A:
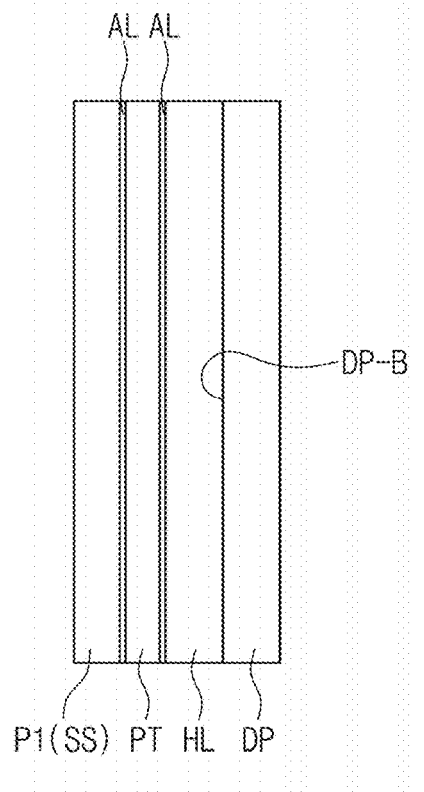
FIGS. 6A through 6D are enlarged side views of a portion of an electronic apparatus according to an embodiment of the present disclosure.

FIG. 6A is an enlarged side view of the lower side of the chassis SS.

Referring to FIG. 6A, the thermoelectric layer HL, the plate PT, and the chassis SS may be disposed in a direction away from the display panel DP. The thermoelectric layer HL may be disposed on the rear surface DP-B of the display panel DP, and the plate PT may be disposed adjacent to the thermoelectric layer HL.

As illustrated in the drawing, an air layer AL may be formed with a predetermined gap between the chassis SS and the plate PT. In addition, the air layer AL may also be formed with a predetermined gap between the thermoelectric layer HL and the plate PT. Although not illustrated in the drawing, an adhesive may be provided in the air layer AL between the chassis SS and the plate PT to fix the chassis SS to the plate PT. In addition, an adhesive may also be provided in the air layer AL between the thermoelectric layer HL and the plate PT to fix the thermoelectric layer HL to the plate PT. Due to an adhesive layer, the rigidity of the electronic apparatus ED may be improved.

Figure 6B:
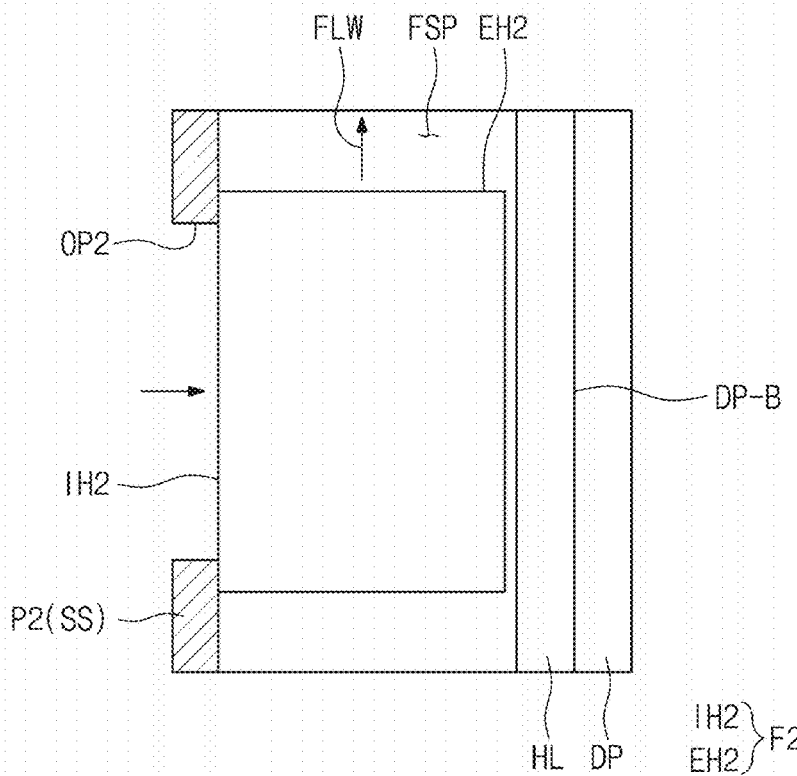

FIG. 6B is an enlarged side view of the second opening OP2 and the second fan F2 of the chassis SS.

Figure 6C:
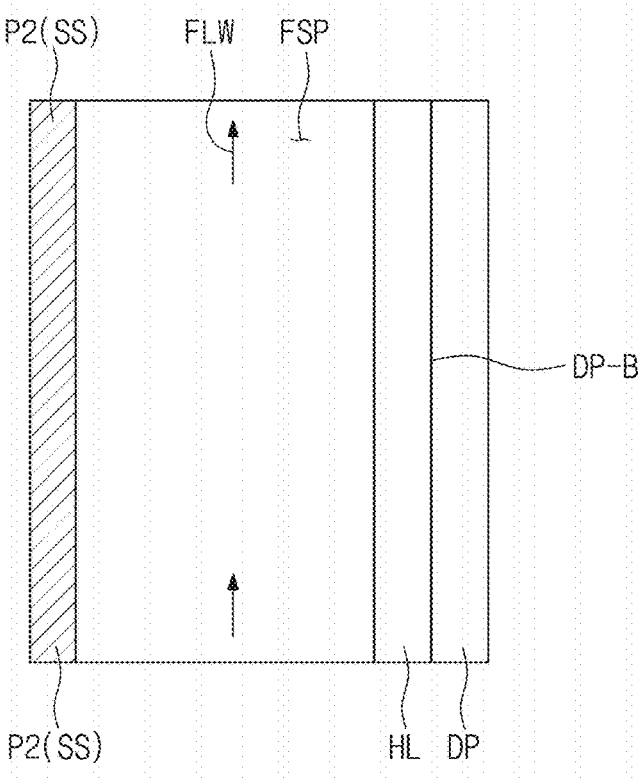
Figure 6D:
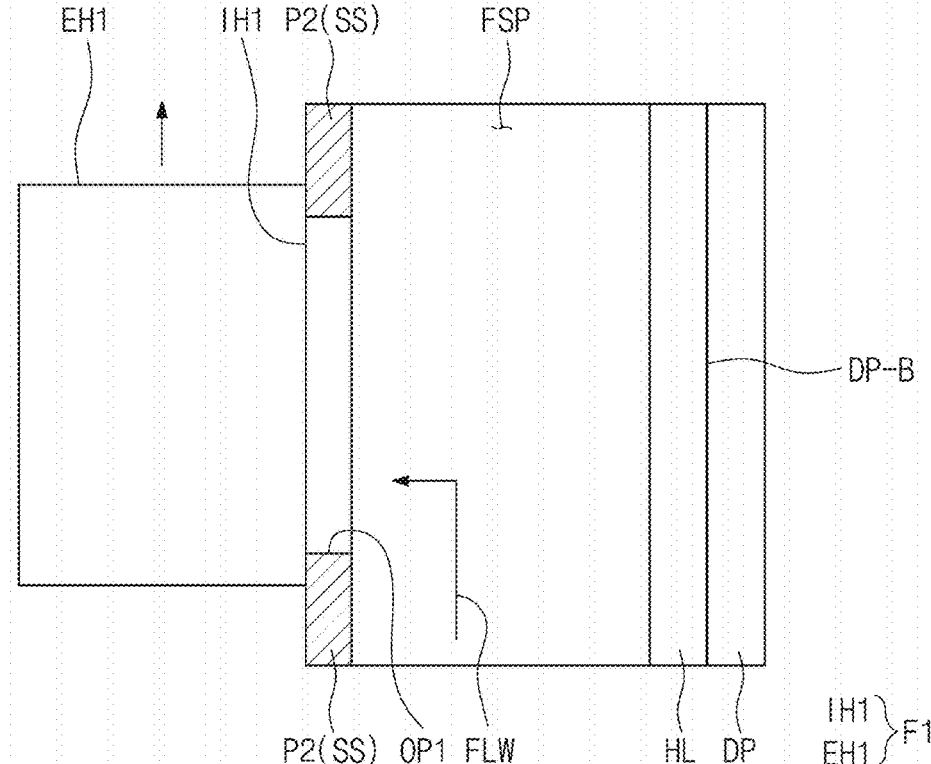

Referring to FIG. 6D, the display panel DP, the thermoelectric layer HL, the second fan F2, and the second opening OP2 or the second part P2 may be arranged in a direction away from the display panel DP. Here, although not illustrated in the drawing, the third opening OP3 previously described in FIG. 5A may be located between the thermoelectric layer HL and the second fan F2.

As illustrated in the drawing, the second fan F2 may be spaced apart by a predetermined distance from the thermoelectric layer HL. However, an embodiment of the present disclosure is not limited thereto, and the second fan F2 may be spaced apart by a predetermined distance from the display panel DP when the thermoelectric layer HL is omitted.

The second fan F2 may be adjacent to the second opening OP2, and may suction gas from the outside into the flow space FSP. In some embodiments, the second fan F2 may cover the second opening OP2 to provide gas (e.g., air) from the outside into the flow space FSP via the second opening OP2.

The second fan F2 may be disposed inside the flow space FSP. That is, the second fan F2 may be disposed on a side opposite to the first fan F1, to be described herein later, with the second part P2 therebetween.

The second fan F2 may be provided to have a thickness corresponding to the flow space FSP. Specifically, the thickness of the second fan F2 may correspond to the gap between the first part P1 and the display panel DP. In addition, when the thermoelectric layer HL is disposed on the rear surface DP-B of the display panel DP, the thickness of the second fan F2 may correspond to the gap between the first part P1 and the thermoelectric layer HL.

By minimizing the gap between the second fan F2 and the rear surface DP-B of the display panel DP or the gap between the second fan F2 and the thermoelectric layer HL, the heat from the rear surface DP-B of the display panel DP or the thermoelectric layer HL may be effectively dissipated by the air current FLW. By minimizing the gap between the second fan F2 and the display panel DP or the thermoelectric layer HL, the insulating effect due to the internal air layer may be minimized. Likewise, in the flow space FSP in which the second fan F2 is not located, the insulating effect due to the internal air layer may also be minimized by minimizing the gap between the second part P2 and the display panel DP or the thermoelectric layer HL.

For example, the second fan F2 may be a circular fan, but an embodiment of the present disclosure is not limited thereto.

The second fan F2 may include a second suctioning part IH2 and a second discharging part EH2. The second suctioning part IH2 may suction gas from the outside, and the second discharging part EH2 may discharge the gas suctioned by the second suctioning part IH2 to the flow space FSP. Accordingly, the air current FLW may be formed in the flow space FSP.

As illustrated in the drawing, both the second suctioning part IH2 and the second discharging part EH2 may be located in the flow space FSP. However, an embodiment of the present disclosure is not limited thereto, and the second suctioning part IH2 may be disposed outside the flow space FSP, and the second discharging part EH2 may be disposed inside the flow space FSP. The locations of the second suctioning part IH2 and the second discharging part EH2 are not limited to any one embodiment of the present disclosure.

FIG. 6C is an enlarged side view of a region between the first opening OP1 and the second opening OP2.

Referring to FIG. 6C, as previously shown in FIG. 5A, an air current FLW from the lower portion to the upper portion may be formed through the air current FLW due to the forced convection phenomenon caused by the cooling module CM, or the natural convection phenomenon caused by the positional relationship between the first opening OP1 and the second opening OP2.

The air current FLW formed at this time may allow the heat exchange with the thermoelectric layer HL or the rear surface DP-B of the display panel DP. Such heat exchange may cause the thermoelectric layer HL or the display panel DP to be cooled, and thus improve the heat dissipation characteristic of the electronic apparatus ED.

Although not illustrated in the drawing, when the circuit board CB (see FIG. 5B previously described) is disposed on one side of the second part P2, the air current FLW formed in the flow space FSP may also emit, to the outside of the flow space FSP, a part of the heat which is transferred from the circuit board CB to the flow space FSP. As a result, the heat dissipation of the electronic apparatus may be achieved.

FIG. 6D is an enlarged side view of the first opening OP1 and the first fan F1.

Referring to FIG. 6D, the display panel DP, the thermoelectric layer HL, the first fan F1, and the first opening OP1 may be arranged in a direction away from the display panel DP. Although not illustrated in the drawing, the plate PT may be disposed between the thermoelectric layer HL and the first fan F1.

The first fan F1 may be disposed outside the flow space FSP. That is, the first fan F1 previously described may be disposed on a side opposite to the flow space FSP with the second part P2 therebetween.

The first fan F1 may include a first suctioning part IH1 and a first discharging part EH1. The first suctioning part IH1 may suction gas in the flow space FSP, and the first discharging part EH1 may discharge the gas suctioned by the first suctioning part IH1 to the outside of the flow space FSP. As a result, the air current FLW may be formed in the flow space FSP.

That is, the heat and the air current FLW, transferred through convection from the lower portion of the flow space FSP to the upper portion of the flow space FSP by the second fan F2, may be discharged through the first fan F1 to the outside of the flow space FSP.

As illustrated in the drawing, both the first suctioning part IH1 and the first discharging part EH1 may be located in the flow space FSP. However, an embodiment of the present disclosure is not limited thereto, and the first suctioning part IH1 may be disposed inside the flow space FSP, and the first discharging part EH1 may be disposed outside the flow space FSP. The locations of the first suctioning part IH1 and the first discharging part EH1 are not limited to any one embodiment of the present disclosure.

For example, the first fan F1 may be a circular fan just like the second fan F2, but an embodiment of the present disclosure is not limited thereto.

Figure 7A:
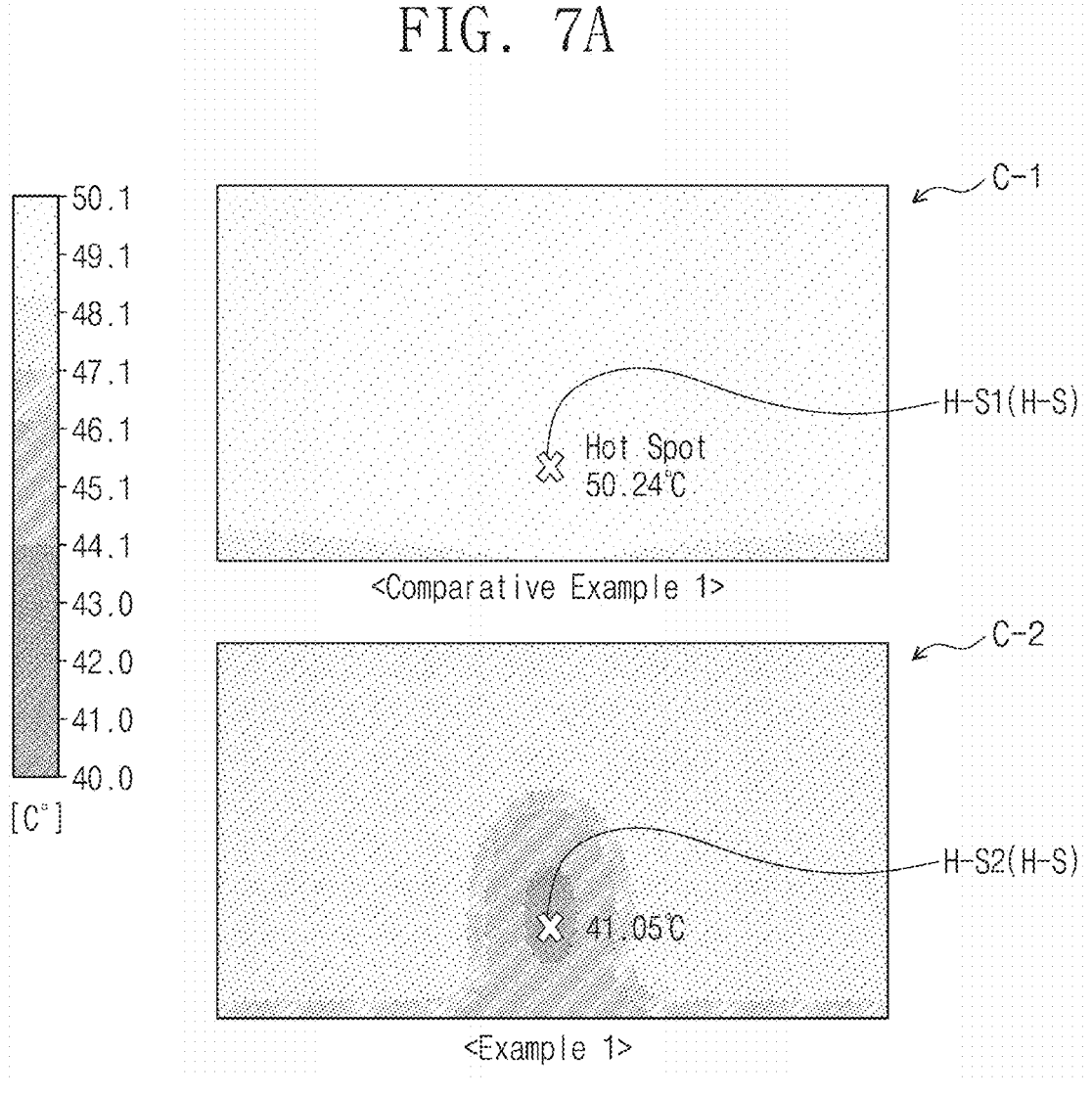
FIGS. 7A and 7B are test data obtained as a result of evaluating heat dissipation characteristics of an electronic apparatus according to an embodiment of the present disclosure and comparative examples.
Figure 7B:
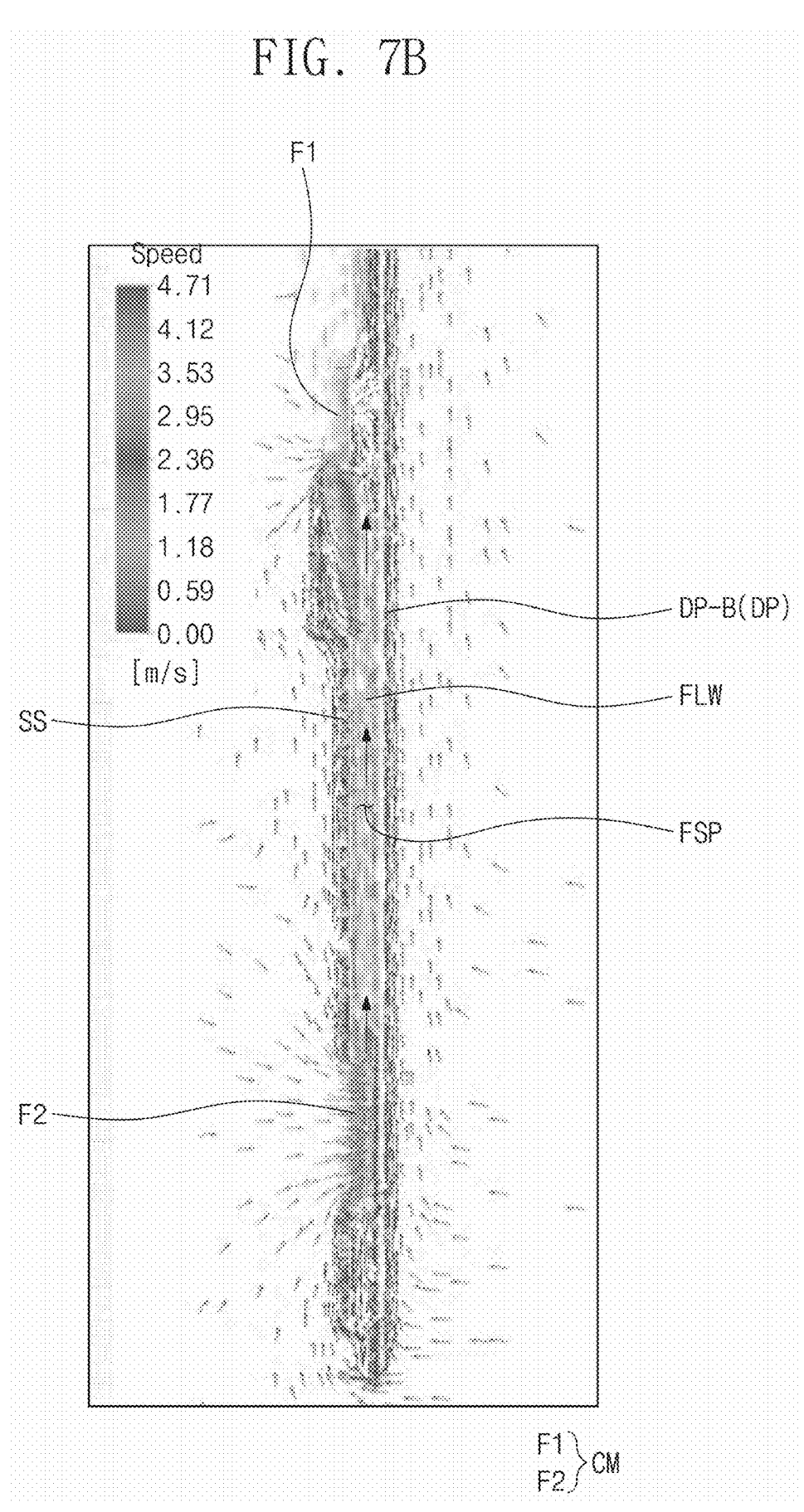

FIGS. 7A and 7B are test data obtained as a result of evaluating the heat dissipation characteristics of the electronic apparatus according to an embodiment of the present disclosure and comparative examples.

Referring to FIGS. 7A and 7B, the drawing in the upper section of FIG. 7A shows a result of Comparative Example 1 C-1 in which the first opening OP1 and the second opening OP2 are omitted from the second part P2. The drawing on the lower section of FIG. 7A shows a result of Example 1 C-2 in which the first opening OP1 and the second opening OP2 are defined in the second part P2. Here, in Example 1 C-2, the first fan F1 and the second fan F2 are disposed in the first opening OP1 and the second opening OP2, respectively.

In Example 2, the first fan F1 is disposed in the first opening OP1, and the second fan F2 is omitted from the second opening OP2.

In Example 3, the first fan F1 is omitted from the first opening OP1, and the second fan F2 is disposed in the second opening OP2.

As previously described, the temperature of the highest temperature region H-S of the display panel may be seen from the test data of FIG. 7A.

Specifically, the highest temperature region H-S1 of the display panel may be observed in Comparative Example 1 C-1, and the highest temperature region H-S2 of the display panel may be observed in Example 1 C-2. Here, the temperature of the highest temperature region H-S1 of the display panel is about 50.24° C. in Comparative Example 1, and the temperature of the highest temperature region H-S2 of the display panel is about 41.05° C. in Example 1.

In Table 1 below, provided are simulated values of the temperature change according to whether an opening is defined in the second opening P2, and according to the arrangement of the first fan F1 or the second fan F2. The temperature at each location in the display panels of FIGS. 6A and 6B, and the changes in temperatures of the display panels of Examples 1 through 3 from the temperature of Comparative Example 1 are shown as presented below. Each temperature change indicates a difference from the temperature of Comparative Example 1.

The simulated value of the temperature change according to each location of the inner space ISP is shown.

and 3. Furthermore, Example 2 is more excellent in heat dissipation effect than Example 3. This is because natural convection may occur at the opening located in the upper portion of the chassis SS and also the gas in the flow space FSP may be discharged to the outside to cause forced convection to occur easily in the flow space FSP. Referring to the data of FIG. 7B, the flow of air in the flow space FSP may be seen. The air current FLW generated due to the difference in air speed at each section of the inner space FSP of the chassis SS may be observed.

Through the natural convection phenomenon caused by the locations of the first opening OP1 and the second opening OP2 and the forced convection phenomenon caused by the first fan F1 and the second fan F2 of the cooling module, the air current FLW is generated in the form of convection from the lower portion to the upper portion in the flow space FSP. That is, gas in the flow space FSP is discharged to the outside of the flow space FSP through the first fan F1, and gas from the outside is introduced into the flow space FSP through the second fan F2. In addition, since the first fan F1 is located in the upper portion of the flow space and the second fan F2 is located in the lower portion of the flow space FSP, the convection phenomenon in which gas flows up and down may occur easily, and thus, electronic apparatus ED may have improved heat dissipation characteristics by using the cooling module.

According to an embodiment of the present disclosure, by positioning the first opening OP1 and the second opening OP2 adjacent to the highest temperature region of the display panel DP, or by positioning the second part P2 adjacent to the highest temperature region of the display panel DP, the time for the air current FLW in the flow space FSP to reach the heating element may be reduced, and the effect of heat dissipation may be effectively enhanced as the straightness to the heating element is improved.

In addition, according to an embodiment of the present disclosure, natural convection in conjunction with forced convection caused by the cooling module CM may be used to improve the effect of heat dissipation of the electronic apparatus ED.

The electronic apparatus according to an embodiment of the present disclosure may cool a display panel by forming a cooling air current in a region adjacent to the display panel.

The electronic apparatus according to an embodiment of the present disclosure may effectively dissipate the heat

TABLE 1

| Location | Comparative Example 1 | Example 1 | Temperature change | Example 2 | Temperature change | Example 3 | Temperature change |
|---|---|---|---|---|---|---|---|
| Highest temperature of display panel DP (° C.) | 50.24 | 41.05 | −9.19 | 40.96 | −9.28 | 42.65 | −7.60 |
| Average temperature of display panel DP (° C.) | 49.12 | 47.97 | 1.14 | 48.32 | −0.80 | 48.72 | −0.40 |

As illustrated in the upper section of FIG. 7A, it may be seen that when the first opening OP1 and the second opening OP2 are omitted, the temperature of the display panel DP is relatively higher than those of the other Examples. In addition, it may be seen that Example 1 C-2 exhibits more excellent heat dissipation effect than those of Examples 2 generated from the display panel, thereby improving the life of internal components and the life of the electronic apparatus.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Therefore, the technical scope of the present invention should not be limited to the contents described in the detailed description of the specification, but should be defined by the claims.

What is claimed is:

1. An electronic apparatus comprising:
a display panel;
a chassis having a first length in a first direction and a second length in a second direction different from the first direction and including:
a first part adjacent to the display panel,
a second part which is connected to the first part and is farther spaced apart from the display panel than the first part, wherein the second part is provided with a first opening and a second opening, and
a flow space disposed between the second part and the display panel and connected to the first opening and the second opening;
a thermoelectric layer located between the display panel and the chassis, and adjacent to the display panel, and
a cooling module disposed on the second part,
wherein the second opening is located to be lower than a reference line passing through a center of the display panel and extending in the first direction.

2. The apparatus of claim 1,
wherein the second part comprises:
a first sub part adjacent to a rear surface of the display panel by a predetermined distance and provided with the first opening and the second opening; and
a second sub part bent from a side of the first sub part toward the rear surface of the display panel and connected to the first part.

3. The apparatus of claim 2,
wherein the second sub part includes a first surface and a second surface spaced apart from each other in the first direction and facing each other with the flow space therebetween,
wherein the first surface and the second surface are bent along the second direction, and
wherein a gap, in the first direction, between the first surface and the second surface changes along the second direction.

4. The apparatus of claim 2,
wherein the first opening is above the second opening in the second direction.

5. The apparatus of claim 2,
wherein a center of the first opening and a center of the second opening are disposed in a straight line extending in the second direction.

6. The apparatus of claim 1,
wherein the second opening is defined at a location of the chassis, corresponding to about 5% to about 35% of a height, in the second direction, of the display panel.

7. The apparatus of claim 3,
wherein the cooling module comprises at least one of a first fan adjacent to the first opening and a second fan adjacent to the second opening.

8. The apparatus of claim 7,
wherein the first fan is located inside the flow space, and wherein the second fan is located outside the flow space.

9. The apparatus of claim 7,
wherein the first fan comprises a first suctioning part configured to suction gas in the flow space, and a first discharging part configured to discharge the gas suctioned by the first suctioning part to the outside of the first fan, and
wherein the second fan comprises a second suctioning part configured to suction gas from the outside of the second fan and a second discharging part configured to discharge the gas suctioned by the second suctioning part to the flow space.

10. The apparatus of claim 1,
wherein the thermoelectric layer is made of carbon.

11. The apparatus of claim 1,
wherein a thickness of the thermoelectric layer is less than or equal to a thickness of the display panel.

12. The apparatus of claim 2, further comprising:
a plate disposed between the rear surface of the display panel and the chassis,
wherein the plate has a third opening defined therein, and
wherein, when the plate and the chassis are projected onto a same plane, the first opening and the second opening are disposed within an outer boundary of the third opening.

13. The apparatus of claim 2, further comprising:
a circuit board spaced apart from the rear surface of the display panel,
wherein the chassis is disposed between the circuit board and the rear surface of the display panel.

14. An electronic apparatus comprising:
a display panel;
a chassis having a first length in a first direction and a second length in a second direction different from the first direction and including:
a first part adjacent to the display panel,
a second part which is connected to the first part and farther spaced apart from the display panel than the first part, wherein the second part is provided with a first opening and a second opening, and
a flow space between the second part and the display panel;
a circuit board spaced apart from the display panel, wherein the second part is disposed between the circuit board and the display panel; and
a cooling module supported by the second part,
wherein the cooling module is configured to form air current in the flow space via the first opening and the second opening, and
wherein the circuit board is located at a region of the second part between the first opening and the second opening.

15. The apparatus of claim 14,
wherein the second part comprises:
a first sub part adjacent to a rear surface of the display panel apart by a predetermined distance and provided with the first opening and the second opening are defined;
a second sub part bent from a side of the first sub part toward the rear surface of the display panel and connected to the first part, and
wherein the circuit board is disposed on the first sub part.

16. The apparatus of claim 15,
wherein a center of the first opening and a center of the second opening are disposed in a straight line extending in the second direction, and
wherein the first opening is defined above the second opening in the second direction.

17. The apparatus of claim 16, wherein the second opening is located to be lower than a reference line passing through a center of the rear surface of the display panel and extending in the first direction.

18. The apparatus of claim 14, wherein the cooling module comprises at least one of a first fan adjacent to the first opening and a second fan adjacent to the second opening, wherein the first fan is located inside the flow space, and the second fan is located outside the flow space.

19. The apparatus of claim 15, comprising a thermoelectric layer located between the rear surface of the display panel and the chassis, and disposed closer to the rear surface of the display panel than to the chassis.

\* \* \* \* \*